United States Patent [19]

Hillenbrand et al.

[11] Patent Number: 4,949,043

[45] Date of Patent: Aug. 14, 1990

[54] APPARATUS FOR RENDERING A STATIC MAGNETIC FIELD UNIFORM

[75] Inventors: David F. Hillenbrand, Groveland, Mass.; Piotr M. Starewicz, North Plainfield, N.J.

[73] Assignee: Resonance Research Inc., Billerica, Mass.

[21] Appl. No.: 365,048

[22] Filed: Jun. 9, 1989

Related U.S. Application Data

[63] Continuation-in-part of Ser. No. 182,953, Apr. 18, 1988, Pat. No. 4,862,087.

[51] Int. Cl.$^5$ ............................................. G01R 33/20
[52] U.S. Cl. .................................... 324/320; 335/219; 335/299
[58] Field of Search ............... 324/300, 307, 309, 318, 324/319, 320, 322; 335/219, 299, 296, 297; 336/225, 227, 232

[56] References Cited

U.S. PATENT DOCUMENTS

| | | | |
|---|---|---|---|
| 4,509,030 | 4/1985 | Vermilyea | 324/320 |
| 4,617,516 | 10/1986 | Schenck | 324/318 |
| 4,656,447 | 4/1987 | Keim et al. | 324/320 |
| 4,727,327 | 2/1988 | Toyoshima et al. | 324/309 |
| 4,733,189 | 3/1988 | Punchard | 324/320 |

Primary Examiner—Michael J. Tokar
Attorney, Agent, or Firm—Paul J. Cook

[57] ABSTRACT

Apparatus is provided for rendering uniform a static magnetic field which includes a plurality of radial and axial coils connected to a controlled power supply. This apparatus permits control of at least the first six orders of gradient of the static magnetic field.

12 Claims, 5 Drawing Sheets

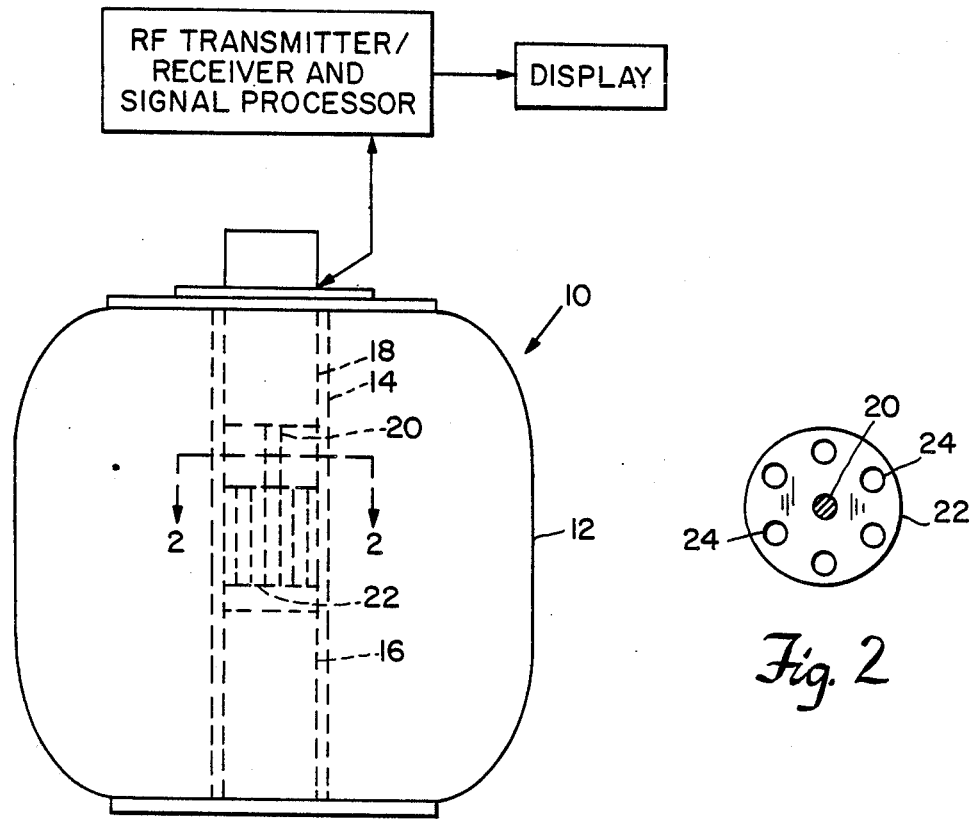
Fig. 1
Fig. 2
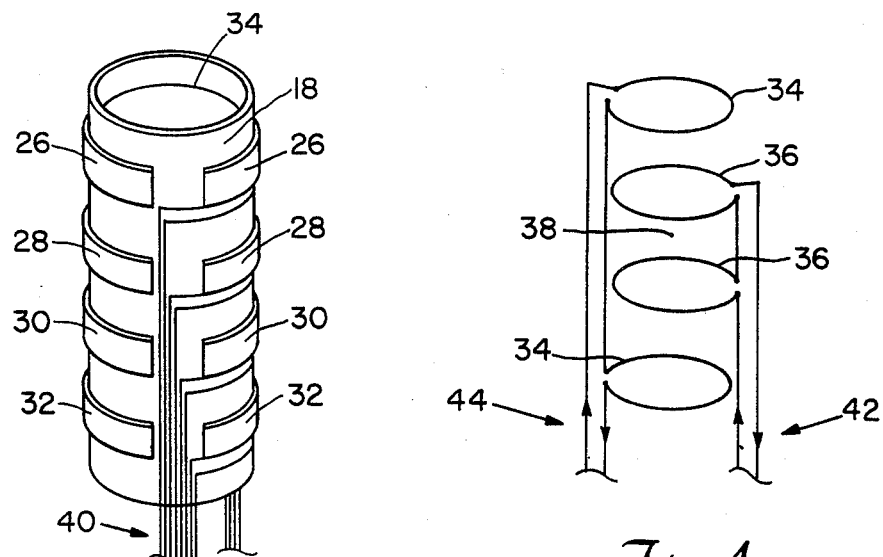
Fig. 3
Fig. 4

APPARATUS FOR RENDERING A STATIC MAGNETIC FIELD UNIFORM

REFERENCE TO RELATED APPLICATION

This application is a continuation in part of application Ser. No. 182,953, filed Apr. 18, 1988, now U.S. Pat. No. 4,862,087.

BACKGROUND OF THE INVENTION

This invention relates to a process and apparatus having a uniform magnetic field and more particularly to apparatus having a uniform magnetic field within which experimentation or sample analysis can be conducted. By the term "uniform" as used herein with reference to the static magnetic field is meant a field having a constant and known gradient and when the gradient is zero the field is "homogeneous".

A variety of apparatus utilize a static magnetic field within which experimentation or sample analysis is conducted Examples of such apparatus include high resolution nuclear magnetic resonance apparatus, magnetic imaging apparatus, ion cyclotron mass spectrometry apparatus or the like. In this apparatus, it is desirable to render uniform the static magnetic field in order to minimize anomalies in measurements.

Nuclear magnetic resonance (NMR) is the resonance effect of an alternating magnetic field at right angles to a stronger static magnetic field to change the orientation of nuclear magnetic moments within the static magnetic filed. The alternating magnetic filed generally is applied as the magnetic component of a radio frequency field which can be applied in a continuous manner ever a frequency range or which can be applied as pulses at a fixed frequency. The applied magnetic field causes an induced signal from the sample which signal is uniquely characteristic for a given nucleus. In order for the measured induced nuclear magnetism to accurately reflect the characteristics of the nuclear sample, it is essential that the static magnetic field be uniform over the sample volume.

The use of currents in coils of various geometry to establish magnetic filed uniformity (homogeneity) is an established paratic. Such practice has resulted in design and utilization of space efficient coils for simultaneous control of various axial gradients of the magnetic field in which each coil addresses more than one axial gradient of the field. Conventional practice of design and utilization of coils for control of radial gradients of the magnetic field have extended to gradients of relatively lower order and typically uses designs in which each coil assembly is used for only one radial gradient of the magnetic field; a spatially inefficient approach if a relatively large number of gradients are to be controlled.

Prior to the present invention, those anomalies in the homogeneity of the static field of nuclear magnetic resonance apparatus not treatable with conventional coils were averaged out by spinning the sample within the most homogeneous volume of the static field. This procedure is undesirable since it requires mechanical apparatus which may itself produce anomalies during measurements due to variations in spin velocity and to slight movements of the spin axis. In addition, the use of apparatus for spinning the sample is undesirably cumbersome.

It has been proposed in U.S. Pat. No. 4,654,592 to analyze a plurality of samples by NMR wherein the samples are arrayed axially along z axis of a room temperature bore located within a superconducting magnet. Such apparatus also requires the loading of discrete samples within the sample cell in advance; and inconvenience. The apparatus permits analysis of a plurality of samples simultaneously. However, the apparatus requires that the samples be spun continuously during analysis thereby necessitating the use of suitable mechanical spinning apparatus.

It would be desirable to provide a method and apparatus for analyzing a plurality of samples by NMR simultaneously or concomitantly in a high resolution NMR apparatus avoids the necessity of spinning the sample. Furthermore, it would be desirable to provide such an NMR apparatus having the uniform static magnetic field over a relatively large fraction of the available room temperature bore so that a plurality of samples can be analyzed simultaneously or concomitantly. In addition, it would be desirable to provide a uniform static magnetic field in apparatus requiring a static magnetic field in order that larger samples can be analyzed.

SUMMARY OF THE INVENTION

In accordance with this invention, there is provided apparatus for rendering uniform a static magnetic field. In one embodiment, the present invention provides high resolution nuclear magnetic resonance apparatus for concurrent analysis of discrete samples or single large sample. The apparatus includes a nuclear magnetic resonance analyzer adapted to concomitantly analyze a plurality of samples at rest which a are located in radially discrete positions. A sample container is provided which is adapted to retain a plurality of discrete samples wherein the samples are retained in radially discrete positions within a volume having a substantially uniform static magnetic field. Alternatively, a plurality of samples can be pumped in sequence through one or more sample retainers within the sample container without spinning the samples. The pumped samples are interspersed with pumped washing fluid. The homogeneous static magnetic field in the NMR apparatus or other apparatus of a solenoidal geometry magnet which is complemented by a plurality of radial and axial coils of specific designs connected to a controlled power supply in order to produce controlled magnetic field gradients. The radial and axial coils as well as the means for providing current thereto are such as to control at least six higher and lower order gradients of the static magnetic field.

BRIEF DESCRIPTION OF THE DRAWINGS

FIG. 1 is a block diagram of an NMR apparatus utilizing this invention.

FIG. 2 is a cross-sectional view of a sample holder of this invention taken along line 2—2 of FIG. 1.

FIG. 3 is a schematic of a hollow cylinder of this invention for securing the radial coils of this invention as well as axial coils.

FIG. 4 is a schematic view of the axial coils of this invention to zero out magnetic gradients.

FIG. 9 is a cross-sectional view of a plurality of radial coil shims and axial coils arranged to zero out a plurality of orders of gradient of a static magnetic field.

DESCRIPTION OF SPECIFIC EMBODIMENTS

Figure 5:
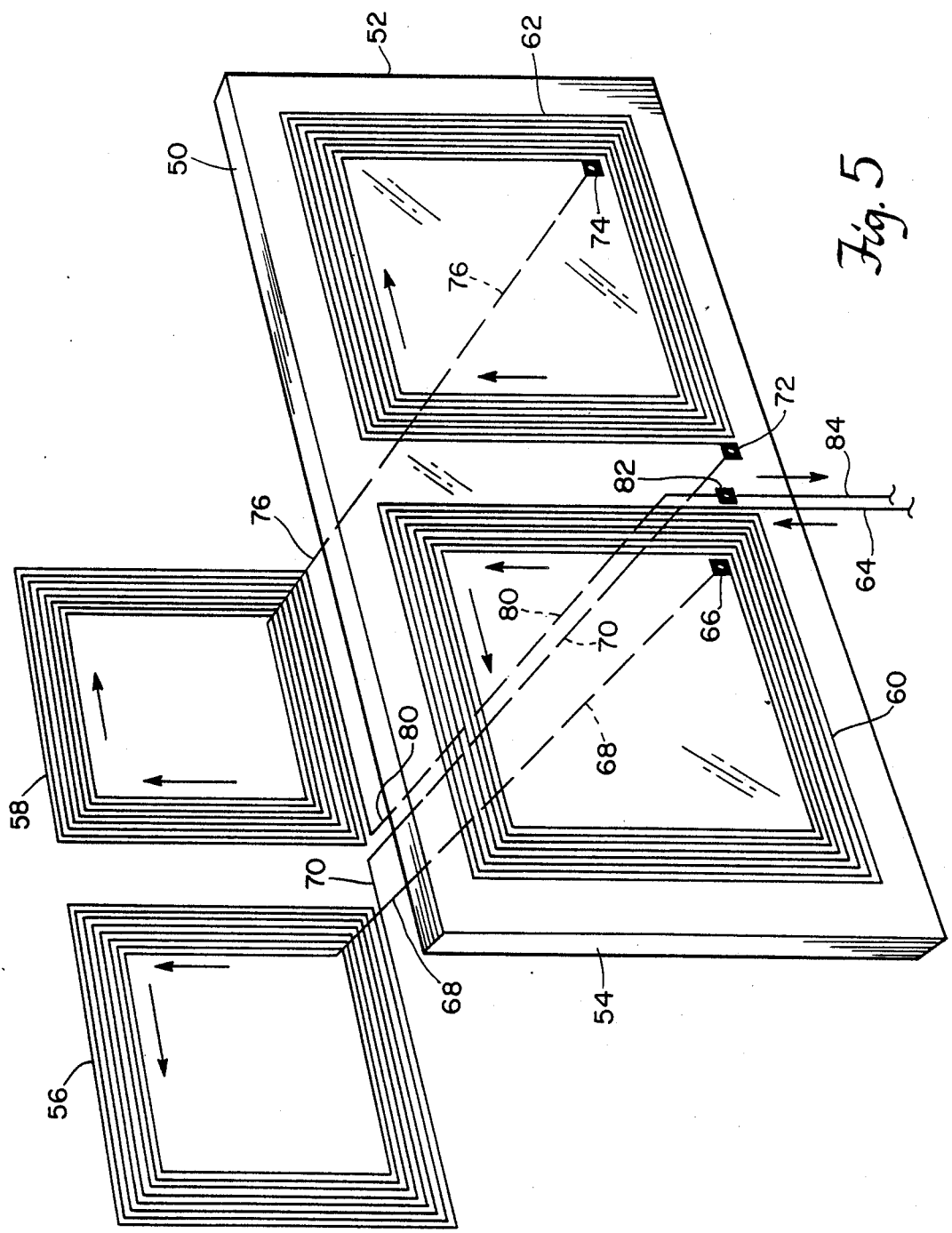
FIG. 5 is an exploded view of a second portion of a radial shim coil arrangement used in conjunction with the arrangement of FIG. 5.

The present invention will be described specifically herein in terms of an NMR apparatus. However, it is to be understood that this invention is useful in any apparatus utilizing a static magnetic field in which uniform magnetic fields are desirable. A uniform static magnetic field also includes fields having a known distribution of gradients over the volume within the room temperature bore. It is the be understood that this invention can be utilized in a superconducting implementation as well as at the room temperature implementation.

In accordance with this invention, a relatively large volume of a uniform static magnetic field is provided by utilizing radial and axial coils positioned within a room temperature bore of a magnet.

The position and design of the coils which are connected to a controlled power supply as well as the current to be provided from the power supply during use is determined by the symmetries of the homogeneity terms to be controlled by an individual assembly and by utilizing a mathematical model to first calculate the field produced from a radial coil composed of those placed at particular radial phase angles and axial positions. The radial magnetic coils are composed of saddle shaped coils while the axial magnetic coils are circular components each formed from multiwinds of wire. Suitable filed equations which are useful for designing the coils are obtainable from the Laplace or Poisson equations for an arc of wire placed at a given radius having a given arc length and a given height from the center of the static magnetic field. The field generated by the coil is calculated for each arc or circle coil and the contributions from the arcs or circles is summed to determine the magnetic field generated by the radial coils or axial coils. The magnetic field generated by the radial coils within the central volume of the static magnetic field can be determined from a sufficient number of gradients of the field at the center thereof by expanding the field such as utilizing a Taylor series or a spherical harmonic expansion. In this procedure, the terms of the expansion are equated order by order to determine the field gradients and the terms of the spherical harmonic expansion coefficients. The spherical harmonic expansion coefficients are set forth in equation 1.

$$H_z = \sum_{m=1}^{\infty} \sum_{m=0}^{n} r^{n-1} [(n-m)\cos\theta\, P_n^m (\cos\theta) + \text{sine}\,\theta\, P_n^{m+1}(\cos\theta)] [A_n^m \cos m\phi + B_n^m \text{sine}\, m\phi]$$

Equation 1

The spherical harmonic functions, $P_n^m$ and $P_n^m 1+$ are expressed in terms of cosine $\theta$. The coefficients $A_n^m$ and $B^{nm}$ express the amount of each spherical harmonic actually observed, r, $\phi$ and $\theta$ are cylindrical coordinates of the point at which the field is being sampled. $\phi\theta$ si the angle in the x y plane and $\phi$ is the z angle, n and m are indices to which the spherical harmonic term is being refereed. The Taylor expansion and the spherical harmonic expansion are equal to each other since both describe the field. Therefore, one can allow the gradients to be grouped according to each term of the spherical harmonic expansion.

After the radial and axial coils have been designed as described in detail below and placed on a cylinder, they are placed within the static magnetic field and the magnetic field resulting from the static magnetic field and the radial and axial coils having current therethrough is napped at a number of points to determine experimentally what the strength of each coefficient is of each term of the spherical harmonic expansion. Since the experimental coefficient is known, and it is known which gradients relate to each term of the expansion, and the field strength of gradient from each coil has been calculated from the model for each gradient, one can determine the gradient in terms of field strength per unit current for each term from the model. Since one has the experimental results of the strength of gradient from each coil has been calculated from the model for each gradient, one can determine the gradient in term from the model. Since one has the experimental results of the strength field required to adjust uniformity, one can determine the current required for each coil contributing to each term of the spherical harmonic expansion, therefor, one can calculate the current needed to be supplied to each coil in order to effect control of magnetic gradients in the static magnetic field.

An NMR may be utilized for mapping the static magnetic field by utilizing a radio frequency (R F) probe containing a small sample which is inserted into the room temperature bore of the magnet to obtain magnetic field measurements at varying radial position at varying heights within the magnetic field. The magnetic field measurements are obtained at axial heights within the bore on both sides of the theoretical zero point of the static magnetic field. Generally, measurement extends to about the distance equivalent to one radius of the coils above and below the filed center. Typically, measurements are taken at a radius extending from the axial center of the bore and at evenly spaced radial angles about the circumference of the bore, e.g., with a 40 mm bore at 30° intervals at 1–3 cm from the axial center and at varying heights surrounding the static magnetic field center. Alternatively, and preferably, the measurements are taken along a spiral path along a helix having a pitch of between about 1 and 5 mm with respect to the vertical axis of the bore of the magnet.

The above described process leads to a geometry comprising a plurality of sets of radial and axial coils. wherein each set comprises an even number of coils comprising at least two coils and wherein each set is designed to control a particular magnetic field gradient. Each set of coil design has at least one set of coils positioned above the center of the magnetic field and at least one set of coils below the center of the magnetic field.

In the present invention, the coils are wound separately in sets wherein the coil or coils of a set are distributed around the circumference of the static magnetic field. The product of current and turns in each coil is varied so that the ampere-turn product can be varied easily by adjusting the current to teach coil. The current to each coil can be varied by adjusting the voltage in the circuit. Alternatively, in a preferred embodiment, an amplifier which produces current under digital control in conjunction with a standard digital to analog converter can be utilized to divide the current so that each coil set receives proper current to effect desired uniformity of the magnetic field gradients.

The coils are wound or driven to produce asymmetric or symmetric field gradients. Odd or even symmetry gradients can be produced with a set of coils if they are powered separately and the direction of the current is controlled. Odd or even symmetry gradients can be produced when a set of coils in wound in pairs, and they are wound together. When utilizing superconducting coils, the coils are arranged in parallel and one switch is utilized form more than one coil or timing several switches on and off at the same time for individual sets of loop elements. In practice in this invention, the radial magnetic coils and axial coils. A probe 18 layers on a cylinder which then is placed the static magnetic field of the solenoisal magnet. It is preferred to form the radial coils or printed circuits on both surfaces of an insulating layer such as a polyimide sheet or a ceramic layer.

Referring to FIGS. 1 and 2, an NMR spectrometer 10 includes a high yield superconducting magnet 12 having a bore 14 into which is positioned a cylinder 16 on which are mounted radial magnetic coils and axial coils. A probe 18 is positioned within bore 14 and is attached by means of cylinder 20 to a sample retainer 22. The sample retainer 22 includes one or a plurality of bores 24 into which sample containers can be fit.

Referring to FIGS. 3, the cylinder 18 has mounted thereon a plurality of rows of radial saddle shaped coils 26, 28, 30 and 32 which are connected to digitally driven amplifiers (not shown). As will be discussed with reference to FIGS. 4-9, a plurality of layers of these saddle shaped coils are positioned at different distances from the vertical axis 18 in order to control greater numbers of gradient orders of the static magnetic field. The D/A converter together with suitable microprocessing means serve to control the current in each coil in order to control orders of magnetic gradient of the magnetic filed. The plurality of layers of radial coils are mounted on the outside surface of cylinder 18 by employing an insulating layer between adjacent layers of radial coils. The axial coils 34 and 36 (See FIG. 4) are mounted on the outside surface of cylinder 18 about static magnetic field center 38. The coils are provided with conventional current feeds 40, 42, and 44.

Referring to FIG. 5, a portion of a radial coil arrangement is shown as an exploded diagram in order to more completely explain the relationship of spiral coil portions positioned on opposite surfaces of an insulating substrate. The substrate comprises a non-conducting material such as a polymer, e.g., polymide or a ceramic upon which substrate a printed conducted circuit can be formed. As shown in FIG. 5, an electrically insulating substrate 50 such as a polyimide is provided. The substrate 50 is flexible so that its ends 52 and 54 can be bonded to each other in the form of a cylinder. The four spiral wound circuits 56, 58. 60 and 62 are connected to each other. Electrical current enters through lead 64, passes around spiral circuit 60 throughput hole 66, through put lead 68, spiral circuit 56, lead 70, throughput hole 72, spiral circuit 62, throughput hole 74, through lead 76, through spiral circuit 58, through lead 80, throughput hole 82 and through exit lead 84. The spiral circuits 56, 58, 60 and 62 are arranged so that the horizontal portions of the radial cells 56, 58, 60 and 62 as indicated by the arrows provide the magnetic field of the radial coils useful for rendering uniform the static magnetic field. The vertical portions of the spiral coils 56, 58, 60 and 62 do not provide a magnetic field utilized to render the static magnetic field uniform. By providing spiral coils on both surfaces of the insulator 50, a greater number of spiral tuns can be included in a smaller volume thereby reducing the volume of the radial coils.

Figure 6:
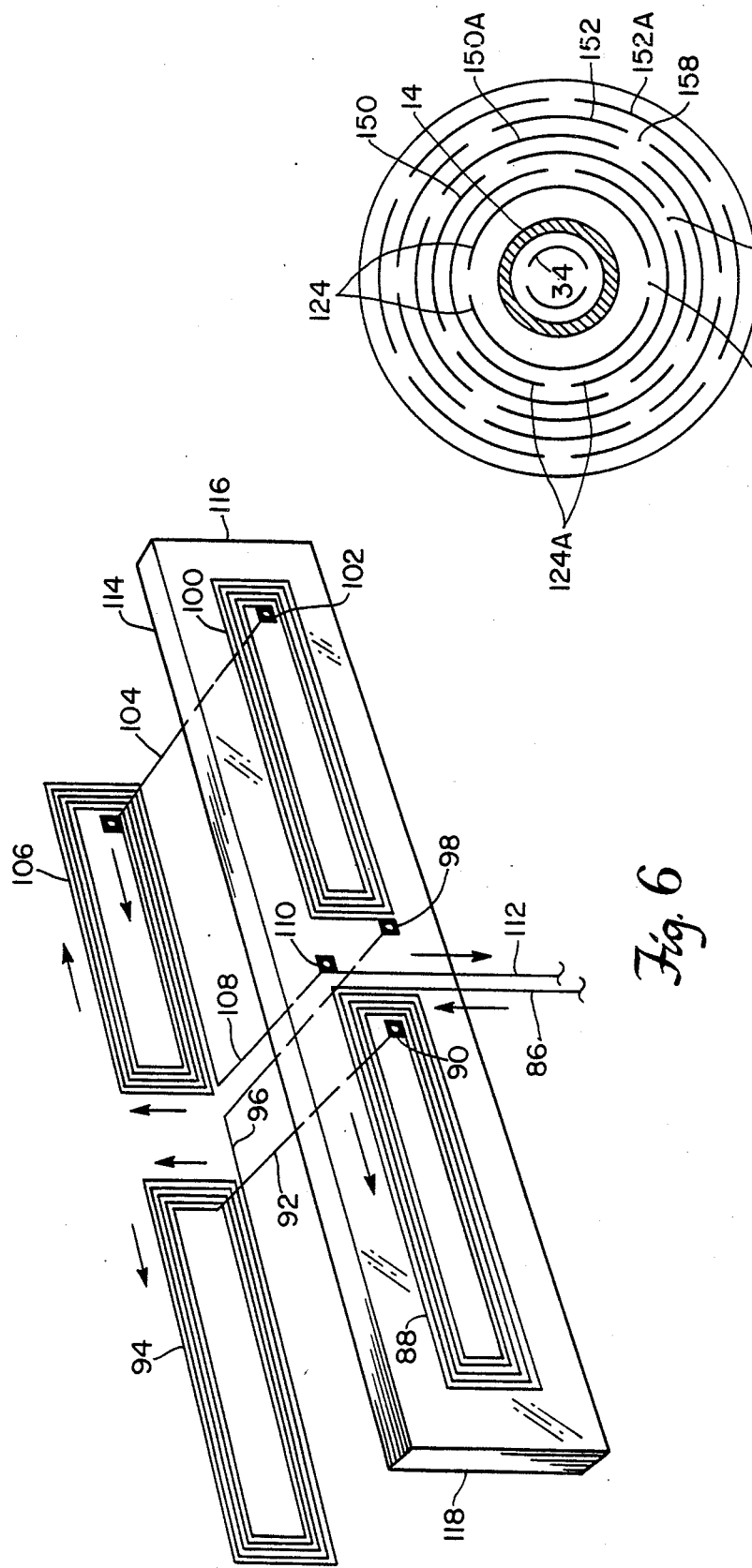
FIG. 6 is an exploded view of a second portion of a radial shim coil arrangement used in conjunction with the arrangement of FIG. 5.

As shown in FIG. 6, a set of spiral coils having a reduced number of turns is provided and is positioned closer to the zero point of the static magnetic field as will be more fully described with reference to FIG. 7. As shown in FIG. 6, current is provided through lead 86, through spiral coil 88, through hole 90, through lead 92, through spiral coil 94, through lead 96, through hole 98, through spiral coil 100, through hole 102, through lead 104, through spiral coil 106, through lead 108, through hole 110, and through exit lead 112.

While these spiral coils are shown in an exploded view of FIGS. 5 and 6 it is to be understood that the spiral coils are mounted directly on the insulating layers 50 and 114 and that insulating layer 50 is curved so that surfaces 52 and 54 are joined to each other while insulator 114 is curved so that surface 116 and 118 are joined to each other. Spiral coils 56 and 60 overlap each other as much as possible for case of implementation. For the same reason, spiral coils 62 and 58 overlap each other. In addition, the horizontal lead 70 and 80 connecting the spiral coils overlap each other as much as possible for cancellation of parasitic fields.

Figure 7:
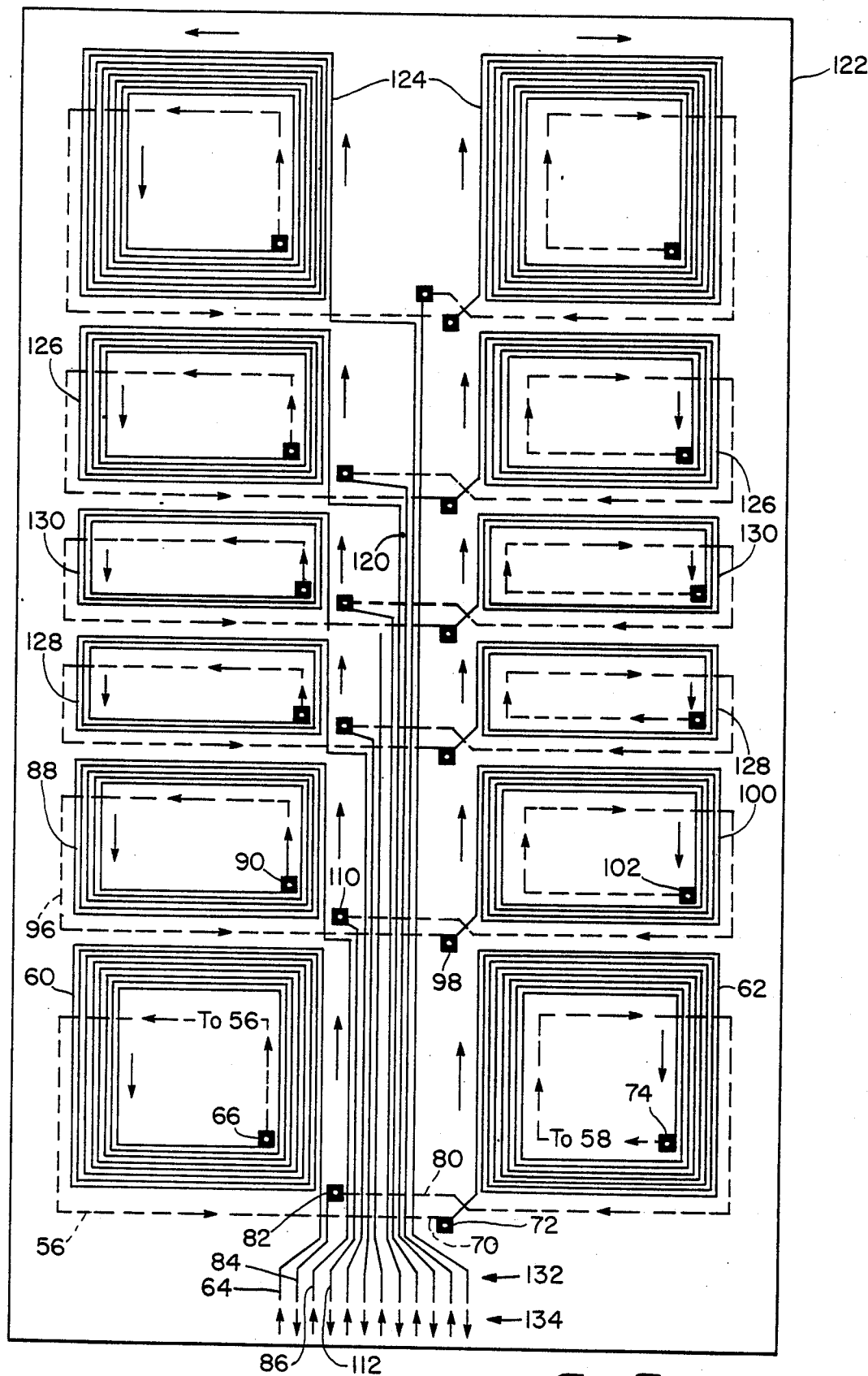
FIG. 7 shows an arrangement of radial coils for zeroing out an order of gradient of a static magnetic field.

As shown in FIG. 7, sets of spiral coils are symmetrically arranged about the center 120 of the static magnetic field. It is to be understood that mating spiral coils are secured to the opposite surface of insulating layer 122 in the manner described in FIG. 5 and 6 and that these mating spiral coils on the opposite surface of insulating layer 122 are interconnected to the set of spiral coils connected to each other as shown in FIG. 7. The set of spiral coils 124 have the same number of coils as the coils 56 and 62. The set of spiral coils 126 has the same configuration as the spiral coils 88 and 100. The set of spiral coils 128 has the same configuration as the set of spiral coils 130. The sets of spiral coils 128 and 130 have fewer turns than the set of spiral coils 126 while the set of spiral coils 126 has fewer turns than the set of spiral coils 124. Typically, for a 40 mm bore diameter, the set of spiral cells 124 has about 5 to 25 turns per side. Typically, the set of spiral coils 126 has 2 to 15 turns per side. Typically, the set of spiral coils 130 has 1 to 10 turns per side. With larger bores greater number of spirals can be used. The set of leads 132 which includes leads 64, 84, 86 and 112 comprise input and exit leads as indicated by the set of arrows 134. Each pair of inlet and outlet leads are typified by leads 64 and 84 as well as leas 86 and 112. Each set of leads, e.g., 64 and 84 as well as leads 86 are connected to a different amplifier and a different connector so that the current to each set of coils at a given radial position can be controlled independently of the other coils located at other positions.

Figure 8:
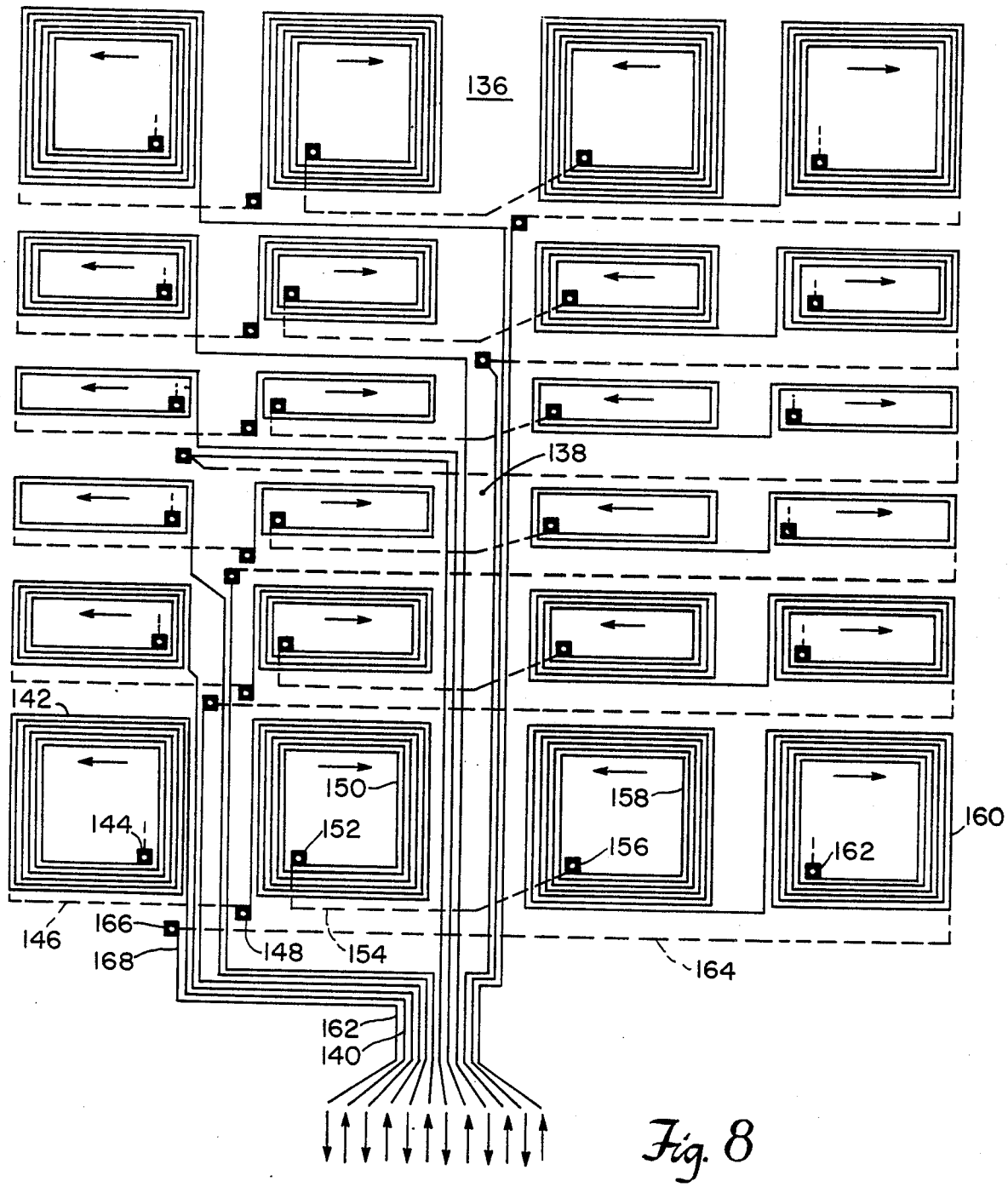
FIG. 8 shows a second arrangement of radial coils of zeroing out a second order of gradient of a static magnetic field.

As well be more fully explained below, the set of radial coils on a given insulating substrate shown in FIG. 7 is complemented by a twin set of coils located on a different insulating substrate. The sets of spiral coils shown in FIG. 7 are positioned 90° from a duplicate set of coils on a different insulating substrate. Each set of coils of the twin sets of coils are positioned either 90° radially from each other so that both the sine and cosine terms of each order of gradient affected by these sets of coils can be rendered homogeneous. The set of coils shown in FIG. 7 not only is utilized in conjunction with a complementary twin set of coils as explained above, but is utilized in conjunction with other sets of coil designs as represented by FIG. 8. As shown in FIG. 8, at each axial position within the magnetic gradient four spiral coils on each surface of an insulating substrate can be utilized rather than only two coils as shown in FIG. 7. Referring to FIG. 8, a set of spiral coils on one surface of an insulating substrate 136 is shown. It is to be understood that a second set of spiral coils is positioned on the opposing surface (not shown) of insulating layer 136 in the manner described above with reference to FIGS. 5 and 6. The current flow path will be described with reference to FIG. 8 in connection with only one set of spiral coils at a given axial position. It is to be understood that the set of coils shown in FIG. 8 are symmetrical about the center 138 of the static magnetic field. Current is introduced through incoming lead 140 into spiral coil 142 through hole 144, into spiral cell 146 an the opposing surface of insulating layer 136. The current then passes though hole 148, coil 150, through hole 152, and into spiral coil 154 on the opposing surface of insulating layer 136. The current then passes through through hole 1256 into spiral coil 158, into spiral coil 160, through hole 162, through outlet lead 164, through hole 166 and through outlet lead 168. Each of the subsets of eight spiral coils at each axial position has the same current flow path as described with reference to FIG. 8 and each set of eight spiral coils is associated with a separate connector and amplifier so that current can be controlled for each coil set independently of the spiral coils at other axial positions. As explained above with reference to FIG. 7, a twin set of coils as that shown in FIG. 8 is positioned 45° from the radial position of the coils shown in FIG. 8 so that the coils shown in FIG. 8 and its complementary twin set of coils function to control both the sine and cosine factors of each order of gradient. It is to be understood that spiral coil configurations other than that shown in FIGS. 5 through 8 can be utilized. For example, a set of twelve spiral coils, six on each surface of an insulating layer can be positioned at a given axial position and current passed therethrough in a manner described with reference to FIGS. 5 through 8.

Six sets of coils are shown in FIG. 9, each set being on a separate insulating layer as described above. For purposes of clarity of discussion, the separate sets of coils on each insulating substrate and the substrate are not shown separately. The separated spiral coils are shown as a top view in cross-section and are representative of an insulating layer and two sets of spiral coils positioned on each insulating layer surface. The axial coil 34 is positioned on the surface of bore 14. The set of coils 124 are positioned 90° from the set of coils 124A. The set of coils 150 are positioned 45° from the set of coils 150A. The set of coils 152 are positioned 30° from the set of coils 152A, The sets of coils are positioned so that at least one set of a twin set has a space 154 between the coils aligned with spaces 156 and 158 of a set within the other twin sets of coils. The specific embodiment shown in FIG. 9 is capable of controlling six orders of gradients of both sine and cosine terms with multiplicity up to and including three sine and cosine terms of argument ($\phi$, $2\phi$ and $3\phi$ of Equation 1). Additional layers of coils can be added to control increased numbers of gradients order and/or higher multiplicities.

The coils can be produced by the processes of U.S. Pat. No. 4,560,445; 4,583,099; 4,666,735 and 4,725,504 which are incorporated herein by reference.

We claim:

1. Nuclear magnetic resonance apparatus of for concurrent analysis of discrete samples which comprises:
   nuclear magnetic resonance analysis apparatus adapted to analyze concomitantly a plurality of samples at rest,
   a sample container adapted to retain a plurality of discrete samples in a solvent, said samples being retained in radially discrete positions within a volume of a magnet within said apparatus having a substantially homogeneous static magnetic field,
   an insulating cylinder positioned within the volume of said magnet and having mounted therein a plurality of electrically conductive radial and axial coils designed to control at least the first 6 orders of the spherical harmonic expansion of gradients of a static magnetic field generated by said magnet,
   said radial coils being spirally wound and comprising a plurality of coils sets,
   each coil set extending about a substantial portion of the circumference of said volume,
   each coil set being connected in series to an electrical current independent of that of all other coil sets,
   and a plurality of signal detection channels, each arranged to couple with one of said samples, and each of said channels communicating with a radio frequency processing apparatus to obtain from said samples resonance spectra.

2. Apparatus having a volume of uniform static magnetic field which comprises:
   a magnet generating a static magnetic field,
   an insulating cylinder positioned within a volume of said magnet and having mounted thereon a plurality of electrically conductive radial and axial magnetic coils positioned within said static magnetic field and sufficient to control at least the first six orders of the spherical harmonic expansion of gradient of the static magnetic field generate by said magnet,
   means for passing current through said radial magnetic coils and said axial magnetic coils to control magnetic gradients in said static magnetic field,
   said radial coils being spirally wound and comprising a plurality of coil sets,
   each coil set extending about a substantial portion of the circumference of said volume,
   and each coil set being connected in series to an electrical current independent of that of all other coil set.

3. The apparatus of any one of claims 1 or 2 wherein coil sets forming said radial coils are positioned on both surfaces of said insulating cylinder and each coil set is separately connected in series.

4. The apparatus of any one of claims 1 or 2 wherein coil sets forming said radial coils are positioned on one surface of said insulating cylinder and each coil set is separately connected in series.

5. The apparatus of any one of claims 1 or 2 wherein at least six insulating cylinders having coil sets forming said radial coils adhered thereto and are positioned at varying radii within said magnetic field.

6. The apparatus of any one of claims 1 or 2 having at least six coil sets forming said radial coils positioned on both surfaces of said insulating cylinder, and each coil set is separately connected in series.

7. The apparatus of any one of claims 1 or 2 having six coil sets forming said radial coils positioned on one surface of said insulating cylinder, and each coil set is separately connected in series.

8. The apparatus of any one of claim 1 or 2 wherein coil sets forming said radial coils are positioned on both surfaces of a flexible polymeric substrate, and each coil set is connected in series.

9. The apparatus of any one of claim 1 or 2 wherein coil sets forming said radial coils are positioned on one surface of a flexible polymeric substrate, and each coil set is connected in series.

10. The apparatus of any one of claims 1 or 2 wherein at least six polymeric insulating layers having coils sets forming said radial coils adhered thereto and are positioned at varying radii within said volume.

11. The apparatus of any one of claims 1 or 2 having six coil sets forming said radial coils positioned on both surfaces of a polymeric insulating layer and each coil set is separately connected in series.

12. The apparatus of any one of claim 1 or 2 having six coil sets forming said radial coils positioned on one surface of a polymeric insulating layer and each coil set is separately connected in series.

* * * * *